United States Patent
Haga

(10) Patent No.: US 7,968,828 B2
(45) Date of Patent: Jun. 28, 2011

(54) TEMPERATURE CONTROLLING METHOD OF ELECTRON BOMBARDMENT HEATING APPARATUS

(75) Inventor: Shigetaka Haga, Ibaraki-ken (JP)

(73) Assignee: Sukegawa Electric Co., Ltd., Takahagi-shi (JP)

( * ) Notice: Subject to any disclaimer, the term of this patent is extended or adjusted under 35 U.S.C. 154(b) by 273 days.

(21) Appl. No.: 12/229,843

(22) Filed: Aug. 27, 2008

(65) Prior Publication Data

US 2009/0008382 A1    Jan. 8, 2009

Related U.S. Application Data

(62) Division of application No. 11/444,727, filed on Jun. 1, 2006, now Pat. No. 7,586,730, which is a division of application No. 10/821,081, filed on Apr. 8, 2004, now Pat. No. 7,320,733.

(30) Foreign Application Priority Data

May 9, 2003    (JP) .................................. 2003-131322
May 28, 2003    (JP) .................................. 2003-150265

(51) Int. Cl.
    *H05B 1/02*    (2006.01)
(52) U.S. Cl. ......... 219/494; 219/497; 427/557; 315/117
(58) Field of Classification Search .................. 219/494, 219/483; 361/230; 315/107, 117; 204/298.01, 204/427; 427/557, 559
See application file for complete search history.

(56) References Cited

U.S. PATENT DOCUMENTS

| 3,638,621 A | 2/1972 | Craig |
| 3,661,139 A | 5/1972 | Randall et al. |
| 4,572,082 A | 2/1986 | Ueda et al. |
| 5,291,859 A | 3/1994 | Brinck et al. |
| 2002/0081863 A1 | 6/2002 | Shimada et al. |
| 2004/0266123 A1 | 12/2004 | Cui et al. |

FOREIGN PATENT DOCUMENTS

| JP | 55-165288 | 12/1980 |
| JP | 55-167041 | 12/1980 |
| JP | 4-224628 | 8/1992 |
| JP | 2000-36370 | 2/2000 |

*Primary Examiner* — Mark H Paschall
(74) *Attorney, Agent, or Firm* — Flynn, Thiel, Boutell & Tanis, P.C.

(57) ABSTRACT

A method of operating an electron bombardment heating apparatus, in which thermions emitted from filaments are accelerated and impinged upon a heating plate, so as to heat the heating plate, wherein a peripheral wall of a heated material supporting member having a heating plate as a ceiling thereof is made up of multi-staged peripheral wall portions, which are stacked vertically and different in the radius thereof, and those peripheral wall portions are connected with each other by a ring-like horizontal wall. With this, thermal stress which is caused due to the difference of temperature between the lower end portion of the heated material supporting member and the heating plate when heating up the heating plate can be mitigated, thereby preventing breakage in the heated material supporting member if conducting heating and cooling upon the heating plate, repetitively.

2 Claims, 4 Drawing Sheets

TEMPERATURE CONTROLLING METHOD OF ELECTRON BOMBARDMENT HEATING APPARATUS

This a division of U.S. Ser. No. 11/444,727, filed Jun. 1, 2006 now U.S. Pat. No. 7,586,730, which is a division of U.S. Ser. No. 10/821,081, filed Apr. 8, 2004 now U.S. Pat. No. 7,320,733.

BACKGROUND OF THE INVENTION

1. Field of the Invention

The present invention relates to a heating apparatus for heating a material, such as, a semiconductor wafer, etc., to be heated to high temperature and, in particular, to an electron bombardment heating apparatus of the type in which accelerated electrons collide or impinge upon a heating plate, thereby generating heat thereon, and it relates to such an electron bombardment heating apparatus, in particular, which is superior in thermal stress-resistance, and also a temperature controlling apparatus and a control method of the electron bombardment heating apparatus, enabling both an increase of temperature with stability and a maintenance of a steady temperature.

2. Description of Prior Art

In processes for treating semiconductor wafers, etc., an electron bombardment heating apparatus of a type in which accelerated electrons are stroked or impinged upon the rear surface of a heating plate, thereby generating heat thereon, is widely used as a means for heating up a plate-like material, such as a semiconductor wafer, etc. In this electron bombardment heating apparatus, thermions generated through conduction of electricity into a filament are accelerated under a high voltage to impinge upon the rear surface of the heating plate, thereby generating heat in the heating plate and a plate-like material mounted on that heating plate is heated.

FIG. 6 attached herewith shows such an electron bombardment heating apparatus of the conventional art. In FIG. 6, though not shown in the figure, an upper portion of a stage portion 106 is located within an inside of a vacuum chamber and a portion of a heating plate 102 is located within a vacuum atmosphere.

In a wall of the stage portion 106, there is formed a coolant passage 107, and through this coolant passage 107 flows a coolant therein, such as water, etc., for example, thereby cooling the stage portion 106.

On this stage portion 106, there is provided a heat-resistive member 101 for supporting a material to be heated (hereinafter, being called by a "heated material supporting member"), having the flat heating plate 102 thereon, on which a thin plate-like material, such as a silicon wafer, for example, can be mounted to be heated, and within an inside thereof, there is defined a space hermetically separated from the outside thereof. In more detail, the heated material supporting member 101 is closed by means of the heating plate 102 on an upper surface side thereof, while being opened on a lower surface side, thereby having a cylinder-like shape. A lower end portion of the heated material supporting member 101 is fixed, abutting on an upper surface of the stage portion 106, and it is also hermetically sealed by means of a vacuum seal member 108.

As a material for making the heated material supporting member 101, for example, a heat-resistive silicon carbide impregnated with silicon, or a ceramic, such as, alumina (or aluminum oxide) or silicon nitride, etc. is used. In a case where the heated material supporting member 101 is made of an insulating material, such as silicon-impregnated silicon carbide, for example, an inner surface of the heating plate 102 is metallized for forming a conductive film thereon, and this conductive film is grounded through the stage portion 106.

On the stage portion 106 is formed an exhaust passage 104, and the space defined within an inside of the heated material supporting member 101 is evacuated by means of a vacuum pump 105 which is connected to the exhaust passage 104, thereby bringing about a vacuum condition therein.

Further, within the inside of the heated material supporting member 101, there are provided filaments 109. Those filaments 109 are located behind the heating plate 102 of the heated material supporting member 101 and, further, reflectors 103 are provided at the rear side of the filaments 109 for the purpose of heat blocking. To those filaments 109 mentioned above are connected a filament heating electric power source 110. Further, between those filaments 109 and the heating plate 102 is applied an acceleration voltage through the heated material supporting member 101 from an electron acceleration electric power source 111. However, the heating plate 102 is grounded and therefore is kept at a positive potential with respect to the filaments 109.

In an electron bombardment heating apparatus as was mentioned above, thermions are discharged from the filaments 109 when conducting electricity into the filaments 109 from the filament heating electric power source 110 and also applying the acceleration voltage of a certain high voltage between the filaments 109 and the heating plate 102 through the electron acceleration electric power source 111, and the thermions are accelerated under the acceleration voltage mentioned above, thereby impinging upon the lower surface of the heating plate 102. For this reason, the heating plate 102 is heated due to the electron bombardment.

When the temperature of the heating plate 102 rises, while measuring the temperature of the heating plate 102 due to the electromotive force generated in a thermocouple 112 by means of a thermometer 114, and when the temperature of the heating plate 102 reaches a predetermined value, the electric power supplied to the filaments 109 is lowered by an electric power adjustor 117, thereby maintaining the temperature of the heating plate 102 at the predetermined value. After passing a predetermined time period, the electricity is stopped to be conducted into the filaments 109, thereby stopping the heat generation of the heating plate 102, while cooling is started by means of the coolant flowing through the coolant passage formed in the stage portion 106, thereby lowering the temperature of the heating plate 102.

The heated material supporting member 101 is cooled on the lower end surface thereof, through a coolant, such as water, etc., flowing through the coolant passage 107 of the stage portion 106; e.g., via the stage portion 106. On the other hand, the heating plate 102 making up an upper wall of the heated material supporting member 101 is heated up, through the bombardment of the electrons, which are discharged from the filaments 109 and accelerated by means of the electron acceleration electric power source 111 of a high voltage. For this reason, a steep thermal gradient is established, in particular, between the heating plate 102 making up the upper wall of the heated material supporting member 101 and the lower end portion of the heated material supporting member 101 in contact with the stage portion 106.

However, the heated material supporting member 101 is made of, for example, a heat-resistive silicon carbide impregnated with silicon, or a ceramic, such as, alumina (or aluminum oxide), or silicon nitride, etc. and, therefore, is weak in thermal stress. For this reason, when starting the heating of the heating plate 102, only the heating plate 102 making up the upper wall of the heated material supporting member 101 shows thermal expansion. Accompanying this, the heated material supporting member 101 deforms and the thermal stress is concentrated, in particular, upon a shoulder portion defined between a peripheral wall portion and the heating plate 102. When repeating the heating and the cooling on the heating plate 102, the heated material supporting member 101 receives the thermal stress, repetitively and, therefore, there is brought about a problem that it fatigues and deteriorates, gradually, thereby resulting in the breakage thereof.

BRIEF SUMMARY OF THE INVENTION

According to the present invention, by taking the problems mentioned above in relation to conventional electron bombardment heating apparatuses into consideration, an object is to provide an electron bombardment heating apparatus, with which the thermal stress can be relieved or mitigated, which is generated due to the difference in temperature between the heating plate, which is heated through the electron bombardment of the heated material supporting member thereon, and the lower end portion of the heated material supporting member, which is cooled down through the stage portion. With this, the heated material supporting member hardly fatigues, even when repeating the heating and the cooling of the heating plate, thereby causing no breakage therein for a long time period.

According to the present invention, for accomplishing the object mentioned above, a heated material supporting member having a heating plate as a ceiling thereof is formed into, not a cylindrical shape having a single radius, but a shape having at least one stage or more in a middle portion thereof. Namely, upper and lower portions of the heated material supporting member are made up with multi-staged peripheral wall portions in a cylinder-like shape, which are different in the radius thereof, and those peripheral portions are connected by means of a ring-like horizontal wall extending in the radial directions thereof. With this, thermal stresses caused by the difference in temperatures between the heating plate of the heated material supporting member and the lower end portion thereof can be mitigated, by means of the multi-staged peripheral wall portions and the horizontal wall connected therewith, thereby protecting it from breaking in an early stage thereof.

Thus, according to the present invention, there is provided an electron bombardment heating apparatus, for heating a heating plate through bombardment of thermions thereon, comprising: a filament for generating thermions therefrom; means for accelerating the thermions emitted from said filament; a heating plate which is heated through the bombardment of the thermions which are emitted and accelerated; and a heated material supporting member for mounting a material to be heated thereon, wherein a peripheral wall of said heated material supporting member, which is covered with said heating plate at a ceiling thereof, is made up of a plural number of stages of peripheral wall portions disposed vertically, which are different from each other in diameter, and those peripheral wall portions are connected with each other through a ring-like horizontal wall extending in radial directions thereof.

With the electron bombardment heating apparatus, according to the present invention, since the peripheral wall of the heated material supporting member, including the heating plate as a ceiling thereof, is made with the multi-staged peripheral wall portions, which have a different radius, in the vertical direction thereof, and since those peripheral wall portions are connected with each other through the ring-like horizontal wall extending into the radial directions thereof, the thermal stresses can be mitigated, by means of the multi-staged peripheral wall portions and the horizontal wall connecting therewith, if a difference is caused in the temperature between the heating plate of the heated material supporting member and the lower end portion thereof, when heating. In particular, since the shoulder portion formed on the heated material supporting member, where the thermal stress can concentrate thereupon, easily, comes to be more than (1) pieces, therefore it is difficult for the thermal stresses to be concentrated on a specific shoulder portion. Accordingly, it is possible to make the thermal stresses small, which is applied upon the heated material supporting member as a whole, and even if repeating the heating and the cooling down to room or steady temperature, it can be protected from breaking in an early stage thereof.

Further, according to the present invention, an insulator plate having a high insulating property and heat-resistance, such as a ceramic plate, etc., is inserted between the plural number of metal reflectors. The reflector 3 below the insulator plate 20 is provided for the purpose of heat insulation but without electrical connection, and the reflector(s) above the insulator plate 20 has the functions of both, i.e., preventing electrons from discharging to a rear side thereof and heat insulation.

Further, according to the present invention, in the electron bombardment heating apparatus mentioned above, thermal control when raising the temperature and when maintaining at a steady temperature are carried out by means of separate control methods. In more detail, when raising the temperature, the total amount of energy of the electrons impinging upon the heating plate is controlled to be constant through controlling the electric power to be supplied to the filament while measuring the emission current, thereby maintaining the thermal gradient at a preset value. In addition, the temperature of the heating plate is measured and after the heating plate reaches the predetermined temperature, the electric power for conducting electricity to the filament by means of the measured value of the temperature, thereby maintaining the heating plate at the predetermined value that is set in advance.

A temperature controlling apparatus, according to the present invention, for achieving such the thermal control as was mentioned above, comprises: an electric power adjuster for controlling the filament electric power to be supplied to the filament; an emission current adjuster, for measuring the emission current flowing between the filament and the heating plate, and for outputting a measurement value of the emission current to said electric power adjuster as a control signal; and a thermal adjuster for measuring the temperature of the heating plate and for outputting the measured temperature value to said electric power adjuster as a control signal, wherein either one of said emission current adjuster or said thermal adjuster is selectively exchanged to be connected with the electric power adjuster, by means of a switch.

A method for controlling the temperature of the heating plate, by means of the temperature controlling apparatus, including therein an electric power adjuster for controlling the filament electric power to be supplied to the filament, comprising the following steps of: controlling the emission current to be a preset value by means of said electric power adjuster, while measuring the emission current flowing between the filament and the heating plate by means of an emission current adjuster, when the temperature of the heating plate raises; and also controlling the temperature of the heating plate to a preset temperature by means of said electric power adjuster, while measuring the temperature of the heating plate by means of a thermal adjuster, after the measured temperature reaches a preset temperature. In this instance, a switch is changed over when the value of the temperature measured by said thermal adjuster reaches the preset temperature or a temperature a little bit lower than the preset temperature.

With the temperature controlling apparatus and method for the electron bombardment heating apparatus, the emission current flowing between the filament and the heating plate is set in advance and when the temperature of the heating plate raises, the electric power adjuster is controlled by means of the emission current adjuster so that the emission current becomes constant while measuring this emission current. With this, it is possible to give a constant electron bombardment upon the heating plate per hour, thereby obtaining a constant thermal gradient with stability.

At the same time, measuring the temperature of the heating plate by means of the thermal adjuster, the electric power adjuster is switched to the side of the thermal adjuster when the temperature of the heating plate reaches the predetermined one, thereby conducting thermal control with the feeding of the temperature of the heating plate back to the electric power adjuster. With this, it is possible to maintain the predetermined temperature in a steady condition, with accuracy and stability.

In this manner, with the electron bombardment heating apparatus according to the present invention, since the thermal stress accompanying the thermal change is dispersed due to the plural numbers of stages of the heated material supporting member and the horizontal wall, fatigue breaking hardly occurs thereon in spite of the thermal stress, which is caused by repeating the heating and the cooling repetitively. For this reason, it is possible to protect the heated material supporting member from being destroyed in an early stage and thereby obtain a heated material supporting member having a longer lifetime.

BRIEF DESCRIPTION OF THE SEVERAL VIEWS OF THE DRAWING

Those and other objects, features and advantages of the present invention will become more readily apparent from the following detailed description when taken in conjunction with the accompanying drawings wherein.

DETAILED DESCRIPTION OF THE PREFERRED EMBODIMENTS

Figure 1:
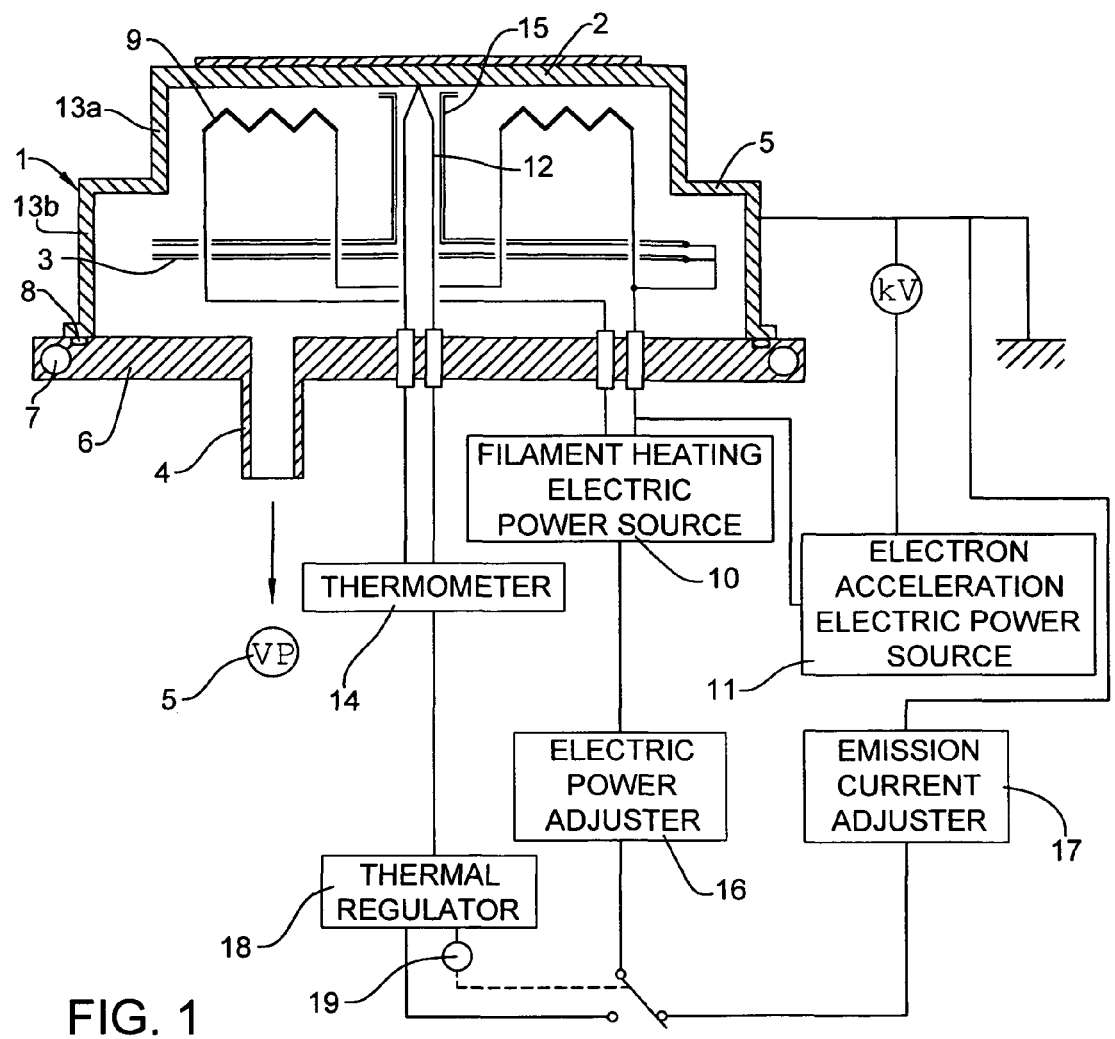
FIG. 1 is a vertical cross-sectional view of a structure of an electron bombardment heating apparatus, for showing an embodiment according to the present invention.

Hereinafter, embodiments according to the present invention will be fully explained, by referring to the drawings attached herewith.

Figure 6:
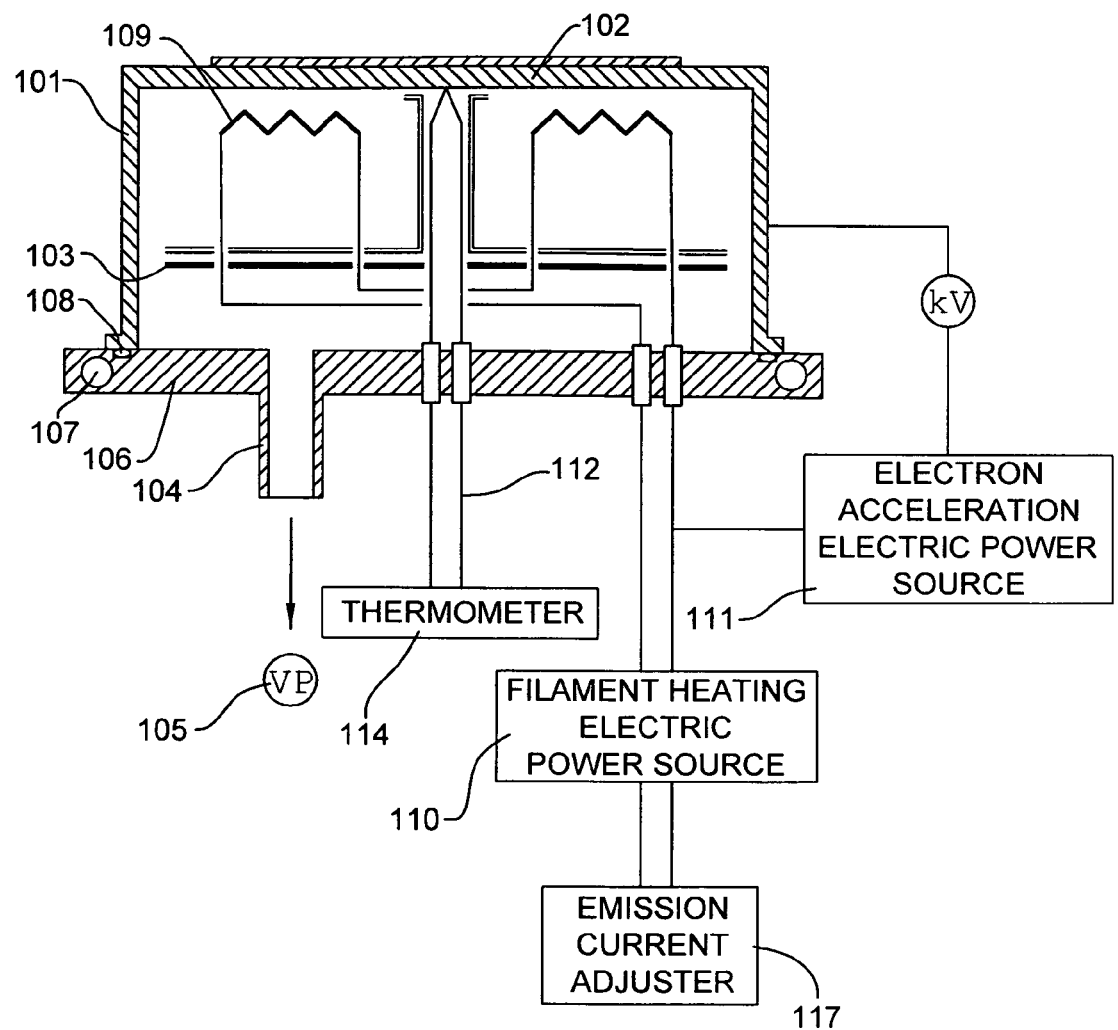
FIG. 6 is a vertical cross-sectional view of a structure of the electronic bombardment heating apparatus, according to the conventional art.

FIG. 1 is a cross-sectional view of a structure of the electron bombardment heating apparatus, showing an embodiment according to the present invention, wherein an upper portion of a stage portion 6 is located within a vacuum chamber, and a portion of a heating plate 2 is within the vacuum atmosphere, in the similar matter of the conventional art, as was mentioned in the above by referring to FIG. 6.

In a wall of the stage portion 6 is formed a coolant passage 7, and the stage portion 6 is cooled by a coolant, such as water, etc., flowing through the coolant passage 7.

On the stage portion 6 is provided a heat-resistive member 1 for supporting a material to be heated (hereinafter called a "heated material supporting member"), having the flat heating plate 2 thereon, on which a thin plate-like material, such as a silicon wafer, etc., can be mounted to be heated up, and within an inside thereof, there is defined a space which is hermetically separated from the outside thereof. In more detail, the heated material supporting member 1 is closed by means of the heating plate 2 on an upper surface side thereof, while being opened on a lower surface side thereof, thereby having a cylindrical shape, and a flat upper surface of the heating plate 2 is wider than the thin plate-like material to be heated, such as a silicon wafer, etc. A flange is provided at the lower end portion of the heated material supporting member 1 and this flange portion is fixed on an upper surface of the stage portion 6 abutting thereon, and it is hermetically sealed by means of a vacuum seal member 8.

The heated material supporting member 1 is made of silicon carbide impregnated with silicon, or a ceramic, such as alumina (or aluminum oxide) or silicon nitride, etc. When the heated material supporting member 1 is made of an insulating material, such as silicon-impregnated silicon carbide, for example, an inner surface of the heating plate 2 is metallized for forming a conductive film thereon, and this conductive film is grounded through the stage portion 6. Also, the same object can be achieved by including conductive materials within the material for building up the heating plate 2, so as to let it have a conductivity.

As is shown in FIG. 1, a peripheral wall of the heated material supporting member 1 is large in diameter at a lower stage thereof, while being small in radius at an upper stage thereof, therefore, it has a cylindrical shape of two (2) stages. The peripheral wall portion 13$b$ is large in radius at a lower stage and the peripheral wall portion 13$a$ small in radius at the upper stage are connected by means of a ring-like horizontal wall 5 extending in a radial direction of the peripheral wall. The peripheral wall portions 13$a$ and 13$b$, being different in the radius thereof, and also the horizontal wall 5 connecting them may be formed, preferably, in one body or as one unit.

In the stage portion 6 is formed an exhaust passage 4, and the space defined within an inside of the heated material supporting member 1 is evacuated by means of a vacuum pump 5, which is connected to that exhaust passage, thereby bringing about the vacuum condition therein.

Further, within an inside of the heated material supporting member 1, there are provided filaments 9 and reflectors 3.

The filaments 9 are provided in the rear side of the heating plate 2 of the heated material supporting member 1, and to those filaments 9 is connected a filament heating electric power source 10 through an insulator seal terminal. This filament heating electric power source 10 is insulated so that the voltage is high at the side of the filaments 9 while it is low at the side of a voltage adjuster 17. Furthermore, between the filaments 9 and the heating plate 2 is applied a voltage for acceleration through the heated material supporting member 1, by means of an electron acceleration electric power source 11. However, the heating plate 2 is grounded and kept at a positive potential with respect to the filaments 9.

The reflectors 3 are provided in the rear side of the filaments 9, with respect to the heating plate 2 of the heated material supporting member 1. The reflectors are made of a metal having a high reflectivity, such as gold (Au), silver (Ag), etc., or a metal having a high melting point, such as molybdenum, etc. The surface of the reflector 3 opposite to the heating plate 2 of the heated material supporting member 1 is made from a mirror surface, thereby reflecting the radiant heat thereupon. Though being electrically insulated from the heated material supporting member 1, however, the reflectors 3 are positioned under the potential condition of being about equal to that of the filaments 9. With this, no electrons fly toward the reflectors 3, thereby not causing any heating due to electron bombardment thereupon. The filaments 9 can be disposed in duplicate.

In the central portion of the reflector 3, a shield 15 made from a cylinder-like conductor is provided, and this shield 15 and the reflectors 3 are electrically connected with each other; i.e., are equal in the potential thereof. An upper end side of the shield 15 reaches up to the vicinity of the lower surface of the heating plate 2 of the heated material supporting member 1, while a flange is provided extending from the upper end portion of the shield 15 to the outside and, therefore, this flange faces the lower surface of the heating plate 2.

A sheath-type thermocouple 12 is inserted vertically from the central portion of the stage portion 6 mentioned above, as a temperature measuring element, and an upper end side of this is disposed within the shield 15 under a non-contacting condition. The upper end of this thermocouple 12, connecting a pair of lines of thermocouples as a junction, builds up a temperature measurement point within the shield 15 mentioned above, and the temperature measurement point is in contact with the lower surface of the heating plate 2 via an insulator tube. The thermocouple 12 is wired out from the stage portion 6 to the outside of the vacuum chamber, and a compensation lead wire is connected to a thermometer 14 including a zero point compensation circuit therein.

With this electron bombardment heating apparatus, the thermions are emitted from the filaments 9 when conducting electricity to the filaments 9 by means of the filament heating electric power source 10, while applying a specified high voltage for acceleration between the filaments 9 and the heating plate 2, by means of the electron acceleration electric power source 11, and those emitted thermions are accelerated under the acceleration voltage mentioned above, and impinge upon the lower surface of the heating plate 2. For this reason, the heating plate 2 is heated due to the electron bombardment thereupon. In this instance, the coolant flows through the coolant passage 7 formed in the stage portion 6 and, thereby, the heated material supporting member 1 is cooled.

The temperature of the heating plate 2 rises, while measuring the temperature of the heating plate 2 by means of the thermocouple 12, and when the temperature of the heating plate 2 reaches a predetermined value, then the filament heating electric power source 10 for conducting electricity to the filaments 9 is lowered in the electric power thereof and the heating plate 2 is maintained at a predetermined temperature. When passing a predetermined time period, the electricity is stopped to the filaments 9, thereby stopping the heat generation of the heating plate 2, while the cooling is started by means of the coolant flowing through the coolant passage formed in the stage portion 6, thereby lowering the temperature of the heating plate 2.

In this manner, the lower end portion of the heated material supporting member 1 is cooled by means of the cooling water flowing through the coolant passage 7 formed in the wall of the stage portion 6, when heating the heating plate 2. For this reason, a large thermal gradient is established between the lower end portion of the heated material supporting member 1 and the heating plate 2. On the other hand, before the time when heating the heating plate 2 and during the time when cooling it, both the lower end portion of the heated material supporting member 1 and the heating plate 2 are in the vicinity of room or steady temperature, therefore, there is established no thermal gradient therebetween. In this manner, with the repetition of heating and cooling, a large change is caused in the thermal gradient established between the lower end portion of the heated material supporting member 1 and the heating plate 2, repetitively.

Figure 2:
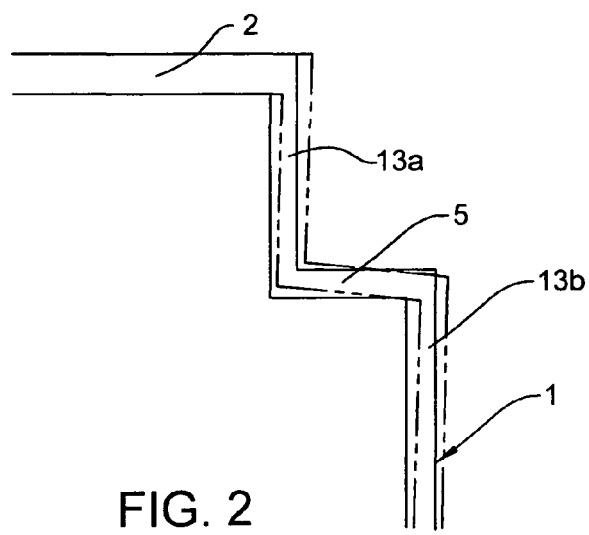
FIG. 2 is a cross-sectional view of a principle portion of the electron bombardment heating apparatus, in particular, for showing a portion of a heated material supporting member thereon, in the embodiment mentioned above.

In this instance, as is shown in FIG. 2, though the heating plate 2 of the heated material supporting member 1, the upper and lower periphery wall portions 13a and 13b, and the horizontal wall 5 expand, and thereby deform, respectively, the expansion mentioned above can be absorbed by the walls neighboring with each other. Further, compared to the conventional electron bombardment heating apparatus shown in FIG. 6 mentioned above, wherein only one shoulder portion is defined between the heating plate 2 of the heated material supporting member 1 and the peripheral wall portions, however according to the electron bombardment heating apparatus shown in FIG. 1, the shoulder portions are defined by three pieces thereof and, therefore, the stress concentrated upon the shoulder portions can be dispersed much more between them. With this, even when applying heating and cooling thereto, repetitively, it is difficult to cause a breakage, in an early stage thereof, due to the thermal stress applied thereon repetitively.

Next, the structure of a temperature controller for use with the electron bombardment heating apparatus will be explained, by referring to the block diagram inserted into FIG. 1.

There is provided an electric power adjuster 16 for the purpose of adjusting the current and voltage for heat generation to be supplied to the filaments 9. In other words, the electric power of the filament heating electric power source 10 for supplying current for use of emission of thermions to the filaments 9.

Further, there are provided an emission current adjuster 17 for the purpose of outputting a control signal to the electric power adjuster 16, and also a thermal regulator 18.

The emission current adjuster 17 has a function of setting or determining the emission current flowing between the heating plate 2 side and the filaments 9 at a predetermined value. Furthermore, while measuring the emission current, this emission current adjuster 17 outputs a control signal to the electric power adjuster 16, so that the emission current is maintained at -a predetermined preset value, thereby adjusting the current and the voltage of the filament heating electric power source 10 for conducting electricity to the filaments 9, by means of this electric power adjuster 16.

On the other hand, the thermal regulator 18 has the functions of setting the steady temperature of the heating plate 2 at a predetermined temperature and, also, setting a time period for maintaining that steady temperature. Further, while measuring the temperature on the lower surface of the heating plate 2 by means of the thermocouple 12 and the thermometer 14 connected thereto, this thermal regulator 18 outputs a control signal to the electric power adjuster 16, so that the temperature of the heating plate 2 is maintained at the predetermined preset value mentioned above, thereby adjusting the current and the voltage of the filament heating electric power source 10 for conducting electricity to the filaments 9, by means of this electric power adjuster 16.

Also, the thermal regulator 18 actuates a switch 19 of a relay, etc., for example. During the rise of the temperature, but before the temperature measured in the thermometer 14 by means of the thermocouple 12 reaches the steady temperature, which is reset by means of the thermal regulator 18, the emission current adjuster 17 is connected to the electric power adjuster 16. Thereafter, when the temperature measured in the thermometer 14 reaches the steady temperature preset by means of the thermal regulator 18, the switch 19 is changed over, so that the thermal regulator 18 is connected to the electric power adjuster 16.

Next, explanation will be given to a method for controlling the temperature of the electron bombardment heating apparatus, with the aid of this temperature controller.

First of all, the emission current to be maintained at a constant level when the temperature rises is set up in advance, by means of the emission current adjuster 17, depending upon the thermal gradient when the temperature of the heating plate 2 rises. Also, by means of the thermal regulator 18, the temperature to be maintained at a constant level is set up in advance, depending upon the object of the thermal treatment or processing of the material to be heated.

When starting the conduction of electricity into the filaments 9 through the filament heating electric power source 10, while applying the constant high voltage for acceleration between the filaments 9 and the heating plate 2, at the same time, by means of the electron acceleration electric power source 11, then the thermions are emitted from the filaments 9, and those thermions, which are accelerated under the acceleration voltage mentioned above, impinge upon the lower surface of the heating plate 2. For this reason, the heating plate 2 is heated due to the electron bombardment. At the same time, the emission current flows between the filaments 9 and the heating plate 2. In this instance, the acceleration voltage applied through the electron acceleration electric power source 11 is made constant.

During the temperature rise of the heating plate 2 but before it reaches the steady temperature, which is set up in advance by means of the thermal regulator 18 mentioned above, the emission current adjuster 17 is connected to the electric power adjuster 16. This emission current adjuster 17, while measuring the emission current flowing between the heating plate side and the filaments, outputs a control signal to the electric power adjuster 16, so that the emission current is maintained at the preset value thereof, thereby adjusting the voltage and the current of the filament heating electric power source 10 for conducting electricity to the filaments 9, by means of this electric power adjuster 16. With this, the emission current flowing between the heating plate side and the filaments 9 is maintained at a constant value when the heating plate 2 raises the temperature thereof. As was mentioned previously, the acceleration voltage, which is applied by means of the electron acceleration electric power source 11, is constant, and also the emission current is maintained at the constant value. For this reason, the energy, given to the heating plate 2 due to the electron bombardment, becomes constant, and the heating plate 2 rises in temperature, at a constant thermal gradient.

Thereafter, when the temperature of the heating plate 2 reaches the steady temperature, which is preset by means of the thermal regulator 18 mentioned above, the switch is actuated, so as to change over the contact thereof and, therefore, the thermal regulator 18 is connected to the electric power adjuster 16. This thermal regulator 18, obtaining or receiving the signal from the thermometer 14 for measuring the temperature on the lower surface of the heating plate 2 by means of the thermocouple 12, outputs a control signal to the electric power adjuster 16, so that the temperature of the heating plate 2 is maintained at a steady temperature, which was preset in the manner mentioned above, thereby adjusting the current and the voltage of the filament heating electric power source 10 for conducting electricity to the filaments 9, by means of this electric power adjuster 16. With this, the temperature of the heating plate 2 is maintained at the preset steady temperature and, when passing the time period that is preset in the thermometer 14, the electricity is stopped from the electron acceleration electric power source 11 to between the filaments 9 and the heating plate 2, thereby lowering the temperature of the heating plate 2.

Figure 3:
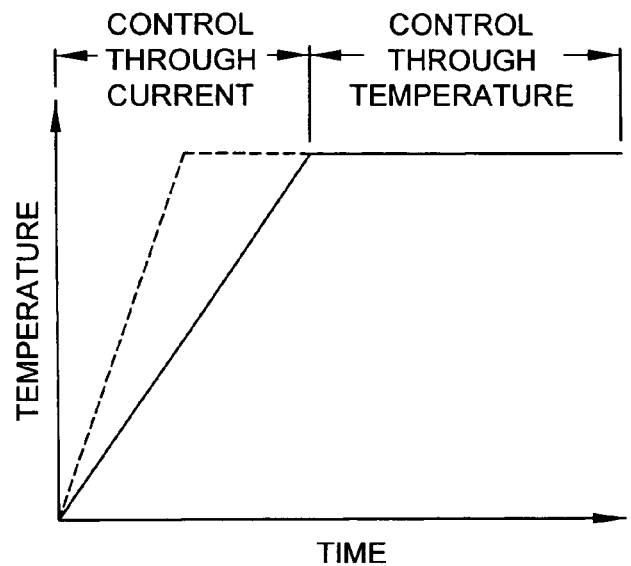
FIG. 3 is a graph showing an example of the relationship between time and temperature when heating up the heating plate, and also the chart of temperature control at that instance therein.

FIG. 3 shows an example of a relationship between time and temperature when heating up the heating plate 2, and also a chart for controlling the temperature in this instance.

As is shown in the figure, when the temperature rises, i.e., from the time of starting the heat generation of the heating plate 2 up to the time of reaching the preset steady temperature, the electric power of the filament heating electric power source 10 is controlled, so that the preset emission current becomes constant, while measuring the emission current, so as to feed it back to the electric power adjuster 16. Since the energy given to the heating plate 2 due to the electron bombardment is determined by the product between the emission current and the acceleration voltage, therefore, with this control, due to the electron bombardment, a constant amount of energy is given to the heating plate 2 per hour, when raising the temperature of the heating plate 2.

On the other hand, after the heating plate 2 reaches the preset steady temperature, the electric power of the filament heating electric power source 10 is controlled, so that the preset steady temperature becomes constant, while measuring the temperature of the heating plate 2, so as to feed it back to the electric power adjuster 16. With this, for a preset time period, the heating plate 2 maintains the preset constant temperature, steadily.

Figure 4:
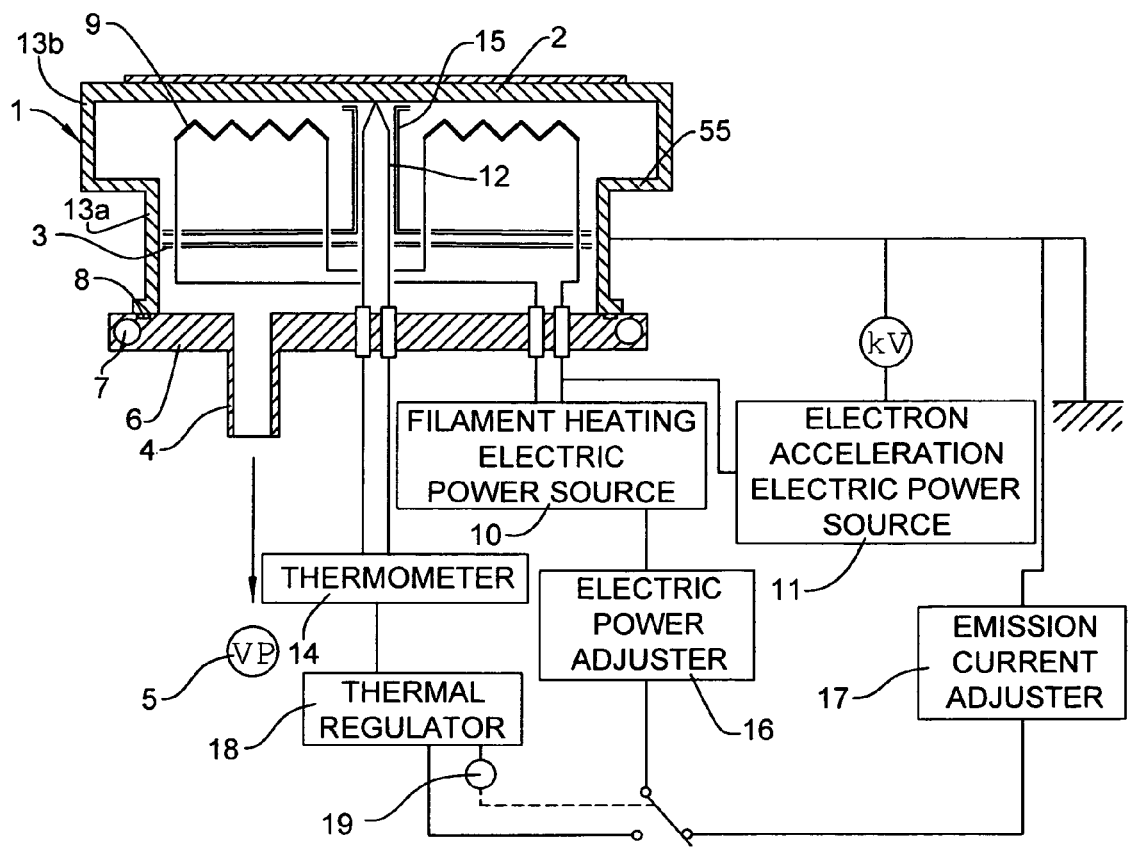
FIG. 4 is a vertical cross-sectional view of a structure of an electron bombardment heating apparatus, showing another embodiment according to the present invention.

FIG. 4 shows another embodiment of the electron bombardment heating apparatus, according to the present invention, wherein the elements, similar to those in the embodiment of the electron bombardment heating apparatus that was shown in FIG. 1 mentioned above, are also given with the same reference numerals. The embodiment of the electron bombardment heating apparatus shown in this FIG. 4 is almost similar to the embodiment of the electron bombardment heating apparatus shown in FIG. 1 mentioned above, and, therefore, explanation will be given only about the portions differing from that. Thus, in the embodiment shown in FIG. 4, the peripheral wall portion 13*a* having a small radius is located lower than the periphery wall portion 13*b* having a large radius, and they are also connected with each other, by means of the horizontal wall provided therebetween. Compared to the embodiment shown in FIG. 1 mentioned above, it is possible to achieve a heating panel 2 which is wider in an area thereof, as the ceiling of the heated material supporting member 1.

Figure 5:
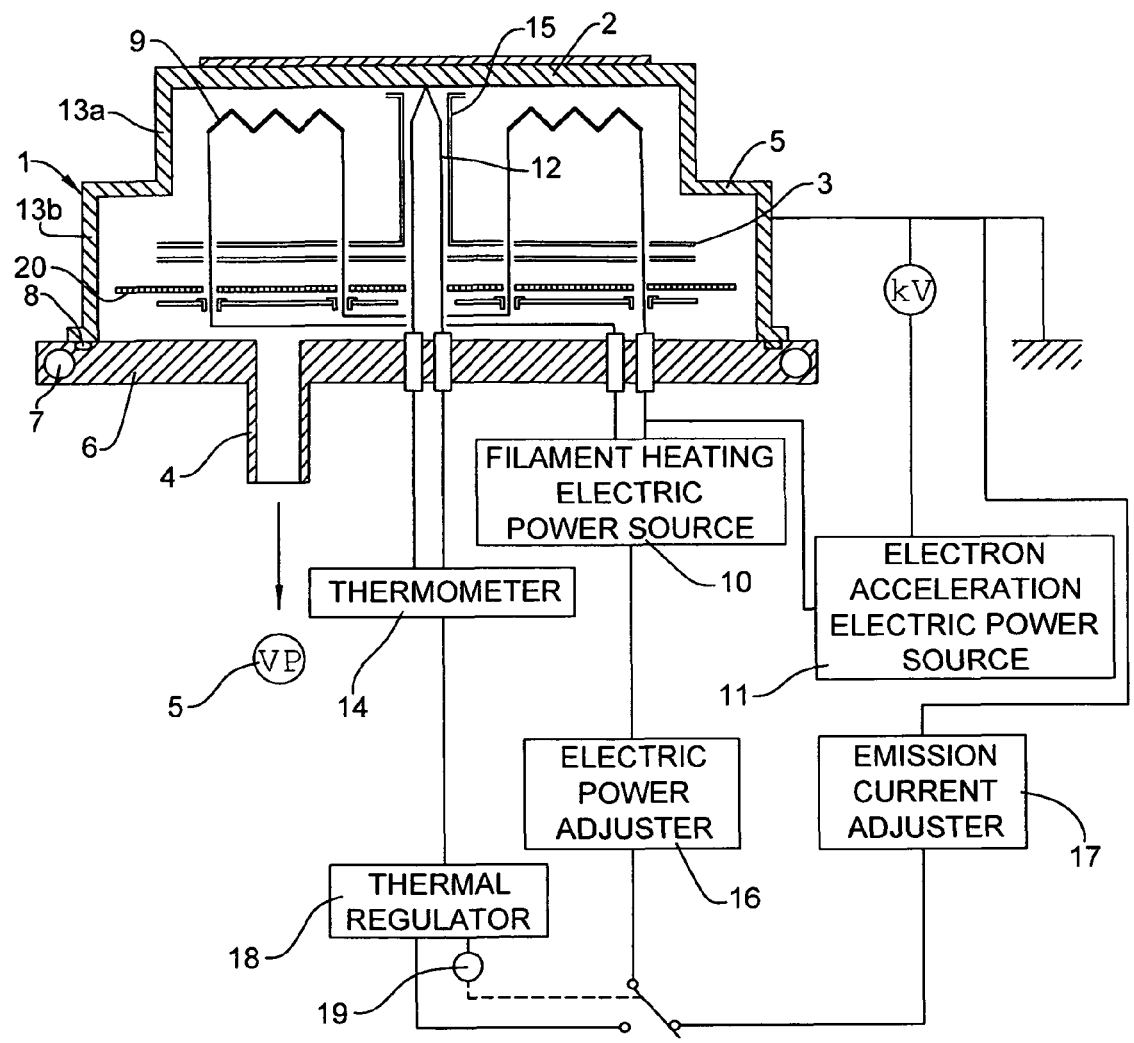
FIG. 5 is a vertical cross-sectional view of a structure of an electron bombardment heating apparatus, showing a further embodiment according to the present invention, in which the structure of a reflector portion is changed.

FIG. 5 shows a further embodiment of the electron bombardment heating apparatus according to the present invention, wherein the elements, similar to those in the embodiment of the electron bombardment heating apparatus that was shown in FIG. 1 mentioned above, are also given the same reference numerals.

The higher the temperature of the heating plate 2, the more thermal loss due to the radiant heat, even if trying to heat the heating plate 2 through the electrons. Then, it is necessary to increase the number of pieces of the reflectors for reflecting the radiant heat thereupon. In general, for every increase in temperature of one hundred centigrade (100° C.) of the heating plate 2, it is necessary to increase the number of pieces of the reflectors 3 by one. However, with the reflectors 3 as shown in FIG. 1 mentioned above, each being made from a metal plate, wiring is needed between them, so as to bring the filaments 9 and the reflectors 3 to be equal in potential, for the purpose of preventing electricity from discharging towards the heating plate 2 and the opposite side thereof.

For eliminating this wiring, as shown in FIG. 5, between a plural numbers of metal reflectors 3 is inserted an insulator plate 20, such as, a ceramic plate, etc., for example, having a high insulation and high heat-resistance, thereby insulating the reflectors 3 positioned vertically from each other. The reflector 3 below the insulator plate 20 is provided for the purpose of heat insulation, but without electrical connection, while the reflectors 3 above the insulator plate 20 each have the functions of both; i.e., preventing electrons from being discharged to a rear side thereof and for heat insulation.

However, in the three embodiments mentioned above, the peripheral wall of the heated material supporting member 1 is divided into two stages of peripheral wall portions and are different in the radius thereof but, in particular, by taking ease of production thereof into consideration, it is also possible to divide the peripheral wall of the heated material supporting member 1 into three or more stages of the peripheral wall portions which are different in the radius thereof. Though an increase of the number of stages of the peripheral wall portions brings about an improvement in the property of dispersing the thermal stress thereupon, however, on the other hand, it increases the fragility thereof with respect to other external forces and, therefore, it is the best to divide the peripheral wall into two stages, and it may be limited up to three (3) stages at the largest.

The present invention may be embodied in other specific forms without departing from the spirit or essential feature or characteristics thereof. The present embodiment(s) is/are therefore to be considered in all respects as illustrative and not restrictive, the scope of the invention being indicated by the appended claims rather than by the foregoing description and the range of equivalency of the claims are therefore to be embraced therein.

What is claimed is:

1. A method of controlling the temperature of a heating plate which is heated by the impingement of accelerated thermions emitted from a filament in an electron bombardment heating apparatus, comprising the steps of:

providing an electric power adjuster for controlling the electric power to be supplied to the filament;

providing an emission current flowing between the filament and the heating plate;

measuring the emission current flowing between the filament and the heating plate with an emission current adjuster;

controlling the emission current to maintain the energy of the accelerated thermions impinging on the heating plate at a constant value during the heating of the heating plate;

measuring the temperature of the heating plate with a thermal regulator; and maintaining the temperature of the heating plate at a desired temperature with the electric power adjuster after the temperature of the heating plate approximately reaches the desired temperature as measured by the thermal regulator.

2. A method of controlling the temperature of a heating plate which is heated by the impingement of accelerated thermions emitted from a filament in an electron bombardment heating apparatus, comprising the steps of:

providing an electric power adjuster for controlling the electric power to be supplied to the filament;

providing an emission current flowing between the filament and the heating plate;

measuring the emission current flowing between the filament and the heating plate;

controlling the emission current to maintain the energy of the accelerated thermions impinging on the heating plate at a constant value during the raising of the temperature of the heating plate;

measuring the temperature of the heating plate with a thermal regulator; and maintaining the temperature of the heating plate at a desired temperature with the electric power adjuster after the temperature of the heating plate approximately reaches the desired temperature as measured by the thermal regulator, wherein when the temperature of the heating plate reaches the desired temperature, as measured by the thermal regulator, a switch switches the connection of the electric power adjuster from the emission current adjuster to the thermal regulator.

* * * * *